(12) United States Patent
Delahoy

(10) Patent No.: US 6,660,538 B2
(45) Date of Patent: Dec. 9, 2003

(54) NON-CONTACTING DEPOSITION CONTROL OF CHALCOPYRITE THIN FILMS

(75) Inventor: Alan E. Delahoy, Rocky Hill, NJ (US)

(73) Assignee: Energy Photovoltaics, Lawrenceville, NJ (US)

( * ) Notice: Subject to any disclaimer, the term of this patent is extended or adjusted under 35 U.S.C. 154(b) by 0 days.

(21) Appl. No.: 10/021,218

(22) Filed: Oct. 29, 2001

(65) Prior Publication Data

US 2003/0082834 A1 May 1, 2003

(51) Int. Cl.$^7$ .......................... G01R 31/26; H01L 21/66; H01L 21/00
(52) U.S. Cl. ................................ 438/14; 438/7; 438/8; 438/12; 438/13; 438/16
(58) Field of Search .............................. 438/12, 13, 14, 438/8, 16, 7; 204/192.22, 192.25; 216/59; 427/10, 248.1, 9, 99

(56) References Cited

U.S. PATENT DOCUMENTS

| | | | | |
|---|---|---|---|---|
| 4,332,833 A | * | 6/1982 | Aspnes et al. | 427/8 |
| RE31,968 E | | 8/1985 | Mickelsen | |
| 5,242,505 A | * | 9/1993 | Lin et al. | 136/258 |
| 5,403,433 A | * | 4/1995 | Morrison et al. | 216/60 |
| 5,858,471 A | * | 1/1999 | Ray et al. | 427/524 |
| 5,871,805 A | * | 2/1999 | Lemelson | 427/8 |
| 6,075,588 A | * | 6/2000 | Pinsukanjana et al. | 356/72 |
| 6,278,809 B1 | * | 8/2001 | Johnson et al. | 385/12 |
| 6,365,016 B1 | * | 4/2002 | Iacovangelo et al. | 204/192.38 |
| 6,383,824 B1 | * | 5/2002 | Lensing | 438/14 |

OTHER PUBLICATIONS http://mineral.galleries.com/mineral/sulfides/chalcopy/chalcopy.htm.*
http://cst-www.nrl.navy.mil/lattice/struk/e1_1.html.*
Ohring, M., Material Science of Thin Films, Academic, 2002, pp. 104–106, 180–181, 197, 573–576, 592, 609.*
Blume, R. and Drummond, III, C Modeling and Optimization of Solar–Control Glasses, J. Am. Ceramic Soc. 85[5]p. 1076–76, 2002.*
Zouaoui, A. et al., "Structural, compositional and photoluminescence characteristics of CuInSe2 thin films prepared by close spaced vapor transport", Thin Solid Films, 339 (1999) pp. 10–18.*
Lux–Steiner, M.Ch. et al., "Processes for chalcopyrite–based solar cells", Thin Solid Films 361–362 (2000) pp. 533–539.*
L. Stolt, et al, "Thin Film Solar Cell Modules Based On CU(IN,GA)SE$_2$ Prepared By The Coevaporation Method" 13$^{th}$ European Photovoltaic Solar Energy Conference and Exhibition, Nice,France Oct. 23–27, 1995.
M. Powalla, et al, "Continuous Cu(In,Ga)Se$_2$ Deposition With Improved Process Control" 14$^{th}$ European Photovoltaic Solar Energy Conference, Barcelona, Spain, Jun. 30–Jul. 4, 1997.
M.A. Contreras, et al, "Prog, Photovolt: Res. Appl. 7" 311–316 (1999).
A. Delahoy, et al., "Advances in Large Area CIGS Technology" 28th IEEE Photovoltaic Specialists Conference, Anchorage, Alaska, Sep. 15–22, 2000.

* cited by examiner

Primary Examiner—Richard Elms
Assistant Examiner—Michael Luhrs
(74) Attorney, Agent, or Firm—McCarter & English, LLP; Allen N. Friedman, Esq.; Christine Johnson, Esq.

(57) ABSTRACT

Chalcopyrite semiconductors, such as thin films of copper-indium-diselenide (CuInSe$_2$), copper-gallium-diselenide (CuGaSe$_2$), and Cu(In$_x$,Ga$_{1-x}$)Se$_2$, all of which are sometimes generically referred to as CIGS, have become the subject of considerable interest and study for semiconductor devices in recent years. They are of particular interest for photovoltaic device or solar cell absorber applications. The quality of Cu(In,Ga)Se$_2$ thin films, as an example of chalcopyrite films, is controlled by making spectrophotometric measurements of light reflected from the film surface. This permits the result of non-contacting measurements of films in a continuous production environment to be fed back to adjust the production conditions in order to improve or maintain the quality of subsequently produced film.

8 Claims, 3 Drawing Sheets

NON-CONTACTING DEPOSITION CONTROL OF CHALCOPYRITE THIN FILMS

BACKGROUND OF THE INVENTION

1. Field of the Invention

The invention is in the field of thin-film devices for conversion of light to electrical energy, such as in the fabrication of solar conversion modules.

2. Brief Description of the Background Art

Chalcopyrite semiconductors, such as thin films of copper-indium-diselenide ($CuInSe_2$), copper-gallium-diselenide ($CuGaSe_2$), and $Cu(In_x,Ga_{1-x})Se_2$, all of which are sometimes generically referred to as CIGS, have become the subject of considerable interest and study for semiconductor devices in recent years. They are of particular interest for photovoltaic device or solar cell absorber applications because solar energy to electrical energy conversion efficiencies (on a total area basis) of 18.8% have been achieved in devices employing $Cu(In_x,Ga_{1-x})Se_2$ with x approximately equal to 0.3 (see M. A. Contreras, B. Egaas, K. Ramanathan, J. Hiltner, A. Swartzlander, F. Hasoon, and R. Noufi, *Prog. Photovolt: Res. Appl.* 7, 311–316 (1999)). This is quite high for current state-of-the-art solar cell technologies. It is generally believed by persons skilled in this art that the best electronic device properties, thus the best conversion efficiencies, are obtained when the mole percent of copper is about equal to the mole percent of the indium, the gallium, or the combination of the indium and gallium in the $Cu(In,Ga)Se_2$ compound or alloy. The electrical band gap of CIGS can be varied between about 1.0 eV to 1.68 eV through variation of the Ga content. The selenium content will not generally be important to the electronic properties of the semiconductor if the growth conditions supply sufficient or excess selenium so that it comprises about 50 at. % of the $Cu(In,Ga)Se_2$ compound to form the desired crystal lattice structures. Sulfur can also be, and sometimes is, substituted for the selenium, so the compound is sometimes referred to even more generically as $Cu(In,Ga)(S,Se)_2$ to comprise all of those possible combinations. A preferred method for the production of large panels of these materials is physical vapor deposition (see, for example, Alan Delahoy, Juergen Bruns, Liangfan Chen, Masud Akhtar, Zoltan Kiss and Miguel Contreras, "Advances in Large Area CIGS Technology" 28th IEEE Photovoltaic Specialists Conference, Anchorage, Ak., Sep. 15–22, 2000). An extensive review of work in this area can be found in U.S. Pat. No. #Re.31,968 issued in 1985 to R. Mickelsen, et al.

The energy conversion efficiency of these devices depends critically on their composition. For example, for $Cu(In,Ga)Se_2$ devices, it has been observed that the highest energy conversion efficiencies occur when the ratio of copper to indium plus gallium is from approximately 0.8 to approximately 0.95. At lower ratios the film resistivity is too high and for higher ratios, the films become too metallic in nature.

In physical vapor deposition processes, it is common to control the deposition rate of each constituent by controlling the temperature of that source. While it is possible to set up a production system to approximately reproduce the desired deposition rates based on individual measurements made before a deposition run, in order to achieve acceptable quality control, it is necessary to control these rates during deposition. This has been done on a laboratory scale, for example by optical absorption measurements in the vapor phase in order to infer flux rate (M. Powalla, et al., Proceedings of the 14th European Photovoltaic Solar Energy Conference, Barcelona, Spain, Jun. 30–Jul. 4, 1997, pp.1270–1273) and by mass spectrometer measurements of the depositing vapor (L. Stolt, et al., Proceedings of the 13th European Photovoltaic Solar Energy Conference, Nice, France, Oct. 23–27, 1995).

For commercial production, it would be desirable to be able to perform a non-contacting measurement of a deposited film and to be able to adjust the deposition condition so as to maintain optimum film properties.

SUMMARY OF THE INVENTION

It has been found to be possible to monitor the quality of $Cu(In,Ga)Se_2$ thin films, as an example of chalcopyrite films, by making spectrophotometric measurements of light reflected from the film surface. This permits the result of non-contacting measurements of films in a continuous production environment to be fed back to adjust the production conditions in order to improve or maintain the quality of subsequently produced film. An advantage of this method is that it obtains information about the film directly, and does not require inference of film properties by sampling of the vapor streams. The latter is subject to calibration errors and inaccuracies due to variable loss of In from the growing film via a volatile selenide.

There are many ways of characterizing the color of light reflected from a surface. The tristimulus method measures the light reflected from the object using three sensors filtered to have the same sensitivity as the human eye. Another spectrophotometric method measures the intensity of the reflected light at many wavelengths and determines the position of the color in a three dimensional space (Lab space) specified by a red-green axis, a yellow-blue axis, and a black-white brightness axis.

While the above methods are useful in examining light reflected from a surface, it has been found that another useful quality function for CIGS films can be derived by measuring the surface reflectance at two discrete wavelengths and calculating the ratio between the two reflectances. In a physical vapor deposition process, this quality function is determined for each film as it emerges from the deposition apparatus. This quality function is compared to experimentally predetermined quality measures in a system processor and a control signal is derived and fed back to adjust the deposition conditions so as to drive the system toward improving subsequent product. This spectrophotometric determination is a single, rapid process that is easily adapted to the production environment.

DETAILED DESCRIPTION OF THE INVENTION

Several different methods have been used to deposit semiconductor thin films on substrates for producing, for example, opto-electric devices, such as solar energy conversion panels. In the sputtering process a plasma is created in a low-pressure inert gas near a source target and atoms are ejected from the target. A flux of the target atoms is incident on the substrate being coated. The atomic flux is dependent on the strength of the plasma, which can be varied by varying the voltages producing the plasma. Use of more than one target located in the same or separate plasmas results in the co-deposition of the desired film constituents.

In chemical vapor deposition a reactive gaseous medium is used to convert precursor materials to the desired atomic species for deposition on the substrate. Varying the introduction of constituents into the reaction chamber varies the substrate composition.

In the CIGS system, the process of physical vapor deposition has been used to produce solar energy conversion devices. In this process heating source materials produces a flux of each of the desired constituents. Controlling the source temperature controls the flux rate from each source. Various shuttering devices can also be used to modulate the effects of temperature control.

Figure 1:
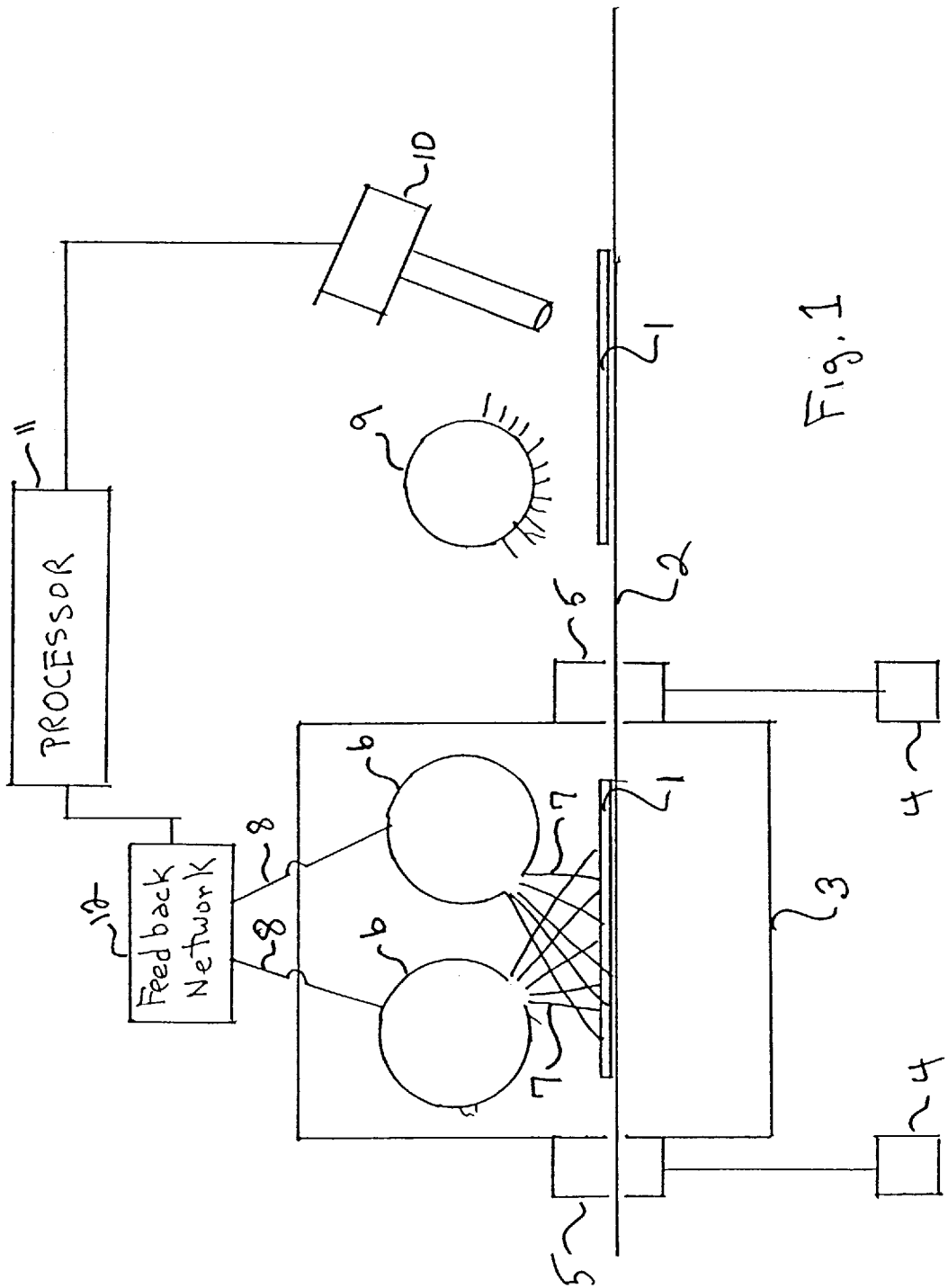
FIG. 1 is a schematic view of an exemplary deposition apparatus, showing non-contacting feedback control of deposition conditions.

FIG. 1 is a highly schematic representation of such a system. Substrates (1) are carried through the system on a conveyor (2). The vacuum chamber (3), in which the deposition takes place, is maintained under vacuum by a suitable vacuum pump. In addition to the chamber's main vacuum pump, the vacuum at the input and output ports is maintained by pumps (4) evacuating vacuum locks (5). In the chamber (3), two sources (6) (as many as four are required for Cu, In, Ga and Se) produce particle fluxes (7). The particle flux rate of each source is controlled by means of individual control links (8).

Figure 3:
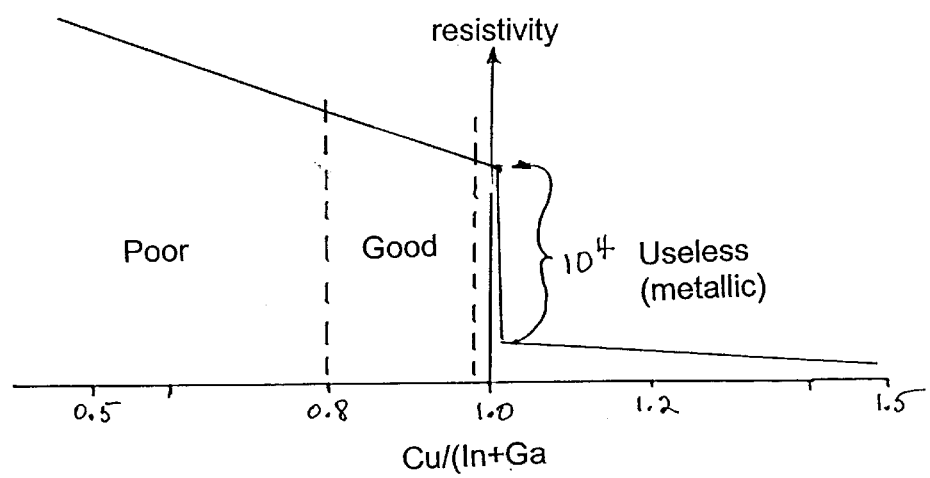
FIG. 3 is a plot showing the resistivity behavior of $Cu(In,Ga)Se_2$ thin film as a function of the Cu to (In+Ga) ratio.

The need to closely control the flux rate from each source (6), thereby controlling the composition of the deposited film is made clear by reference to FIG. 3. FIG. 3 is a plot of the general behavior of the resistivity of CIGS thin films as a function of copper content, more specifically, the Cu to (In+Ga) ratio. It shows that for copper-deficient films (i.e., Cu/(In+Ga)<1), the logarithm of film resistivity varies linearly with copper content. For copper-rich films (i.e., Cu/(In+Ga)>1), the resistivity drops dramatically and the film becomes metallic in nature and therefore useless as a photoconverter. For copper ratios less than approximately 0.7 the film resistivity increases to the extent that conversion efficiencies become poor. The required range for good solar conversion efficiency is from approximately 0.75 to nearly 1.0, with the desired range approximately 0.8 to 0.95. The invention disclosed here is directed to controlling the production of films to maintain their compositions well within that range.

Perhaps the simplest and fastest method of acquiring information about the CIGS film is to measure its color after deposition. With a modern hand-held spectrophotometer containing a pulsed xenon source, integrating sphere and spectral sensor, the reflectance spectrum of a sample can be obtained in a single flash with a repeatability of 0.2%. From this spectrum, the color coordinates in L*a*b Color space (CIELAB space) can be computed. Software is commercially available to perform this calculation. In this color space, L is the lightness, and a (red-green) and b (yellow-blue) are the chromaticity coordinates. These coordinates are calculated from the XYZ tristimulus values.

The color coordinates for a set of CIGS samples with varying Cu/(In+Ga) ratios was determined using a Minolta CM-508D hand-held spectrophotometer. The compositions of these samples were then determined. There proved to be a strong correlation between color and the Cu/(In+Ga) ratio. These interesting results strongly suggest that a quantitative determination of the color of CIGS films can be used to gauge the vitally important Cu/(In+Ga) ratio. Thus, for the usual Cu-poor films, the films become more blue (larger negative values of b) and darker (decreasing L) with increasing (In+Ga) content. Cu-rich films, however, appear more green (a more negative). These observations can be the basis of a fast, non-destructive determination of CIGS color as soon as the CIGS emerges from the production line. Deviations from the predetermined objective coordinates would be used to slightly adjust the source material flux rates to correct the drift from standard composition.

The deposition apparatus of FIG. 1 shows a feedback control arrangement in which the surface of a substrate (1') that has already been through the deposition chamber (3) is irradiated by a light source (9) and reflected light detected by a spectrophotometric device (10). The output signal from the device (10) is fed into a processor (11), such as a PC, a microprocessor or another computational device, where it is compared to a predetermined measure of film quality. The processor (11) generates a control signal adapted to vary the source (6) conditions and flux (7) rates through a feedback network (12) such that subsequently produced films (1) are of improved quality. Of course, at or near optimum film quality little or no correction may be needed.

Figure 4:
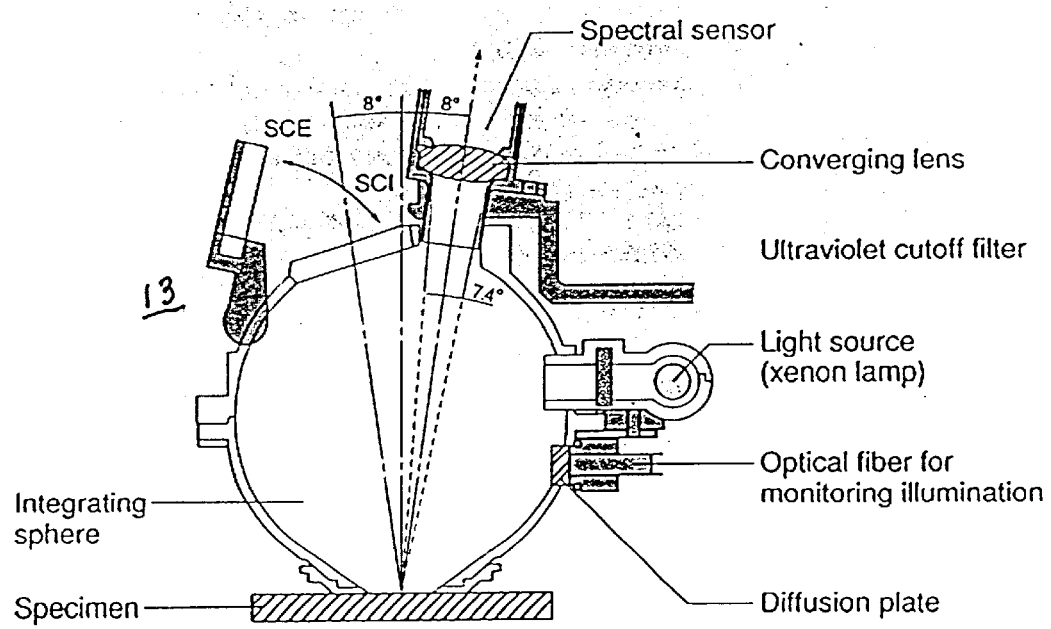
FIG. 4 is an elevational view, in section, of an exemplary spectrophotometric device detecting reflected light from a specimen.

FIG. 4 shows a spectrophotometric device (13) producing light from a light source (14) incident on a specimen (15) with reflected light detected by a spectral sensor (16).

Figure 2:
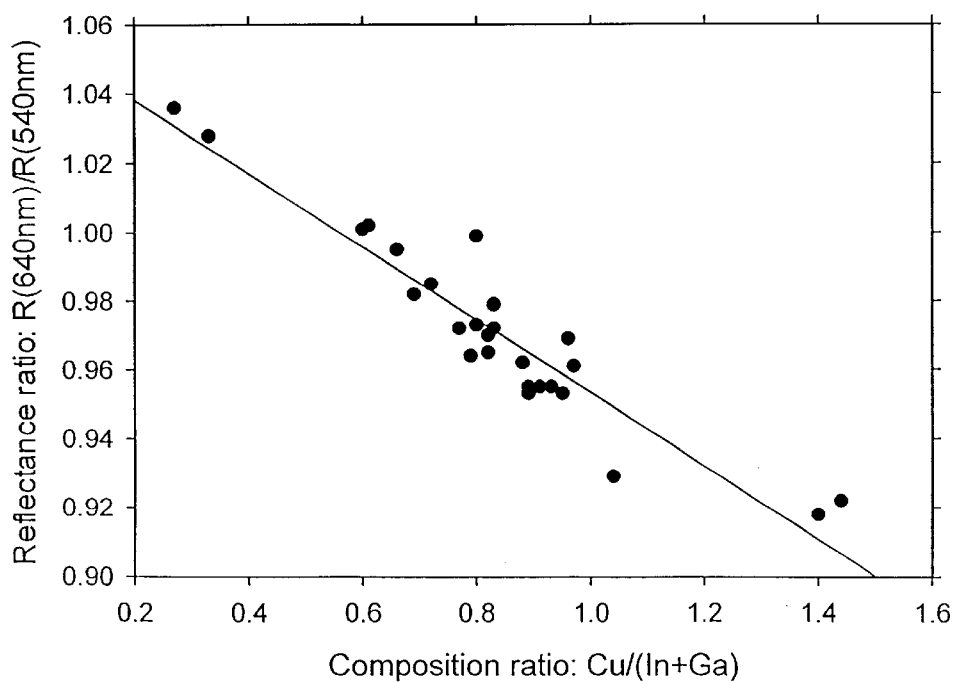
FIG. 2 is a plot of quality function against the composition ratio of Cu/(In+Ga) for exemplary $Cu(In,Ga)Se_2$ thin films.

It has been determined that for $Cu(In,Ga)Se_2$ an easily calculated quality function is formed by using the spectrophotometric device to measure the reflectance of the deposited film (1') at two discrete wave lengths and calculating the ratio of these reflectances. Exemplary reflectance measurements were made at 640 nm, in the red-orange region of the spectrum and 540 nm, in the green. FIG. 2 plots the data as the Cu/(In+Ga) ratio against the quality function thus derived. This generally linear relationship between composition and quality function provides the feedback control mechanism needed to control product quality.

What is claimed is:

1. A method for depositing a chalcopyrite structured semiconductor thin film onto a substrate from at least a first source and a second source, and controlling the thin film's achievable solar conversion efficiency; comprising:

a) controlling the first source-to produce a first particle flux incident on the substrate and controlling the second source to produce a second particle flux incident on the substrate, thereby producing a first deposited thin film;

b) monitoring the first deposited thin film's achievable solar conversion efficiency by:

i) irradiating at least a portion of said first deposited thin film's surface with light comprising a plurality of wavelengths;

ii) detecting light reflected from said first deposited thin film's surface with a spectrophotometric device that produces an output signal directly related to the color of said first deposited thin film's surface; and iii) comparing the output signal with a predetermined measure of the achievable solar conversion efficiency of said first deposited thin film and producing a control signal thereby;

c) feeding said control signal back so as to control at least one of the first source and the second source in order to produce a second deposited thin film of better achievable solar conversion efficiency than the said first deposited thin film.

2. A method of claim 1 in which said first and said second deposited thin films consist essentially of $Cu(In,Ga)Se_2$.

3. A method of claim 2 in which said producing of a first deposited thin film is accomplished by sputter deposition or chemical vapor deposition.

4. A method of claim 2 in which the depositing is accomplished by a physical vapor deposition process and the first particle flux is controlled by controlling a first temperature of the first source and the second particle flux is controlled by controlling a second temperature of the second source, and using the control signal to control at least one of the first temperature and the second temperature.

5. A method of claim 2 in which the output signal of the spectrophotometer identifies said first deposited thin film's surface's reflectance at at least a first and a second discrete preselected wavelength.

6. A method for depositing a chalcopyrite structured semiconductor thin film onto a substrate from at least a first source and a second source, and controlling the thin film's achievable solar conversion efficiency; comprising:
   a) controlling the first source to produce a first particle flux incident on the substrate and controlling the second source to produce a second particle flux incident on the substrate, thereby producing a first deposited thin film;
   b) monitoring the first deposited thin film's achievable solar conversion efficiency by:
      i) irradiating at least a portion of said first deposited thin film's surface with light comprising a plurality of wavelengths;
      ii) detecting light reflected from said first deposited surface with a spectrophotometric device that produces an output signal directly related to the color of said first deposited thin film's surface; and
      iii) comparing the output signal with a predetermined measure of the achievable solar conversion efficiency of said first deposited thin film and producing a control signal thereby;
   c) feeding said control signal back so as to control at least one of the first source and the second source in order to produce a second deposited thin film of better achievable solar conversion efficiency than said first deposited thin film, wherein said first and second deposited thin films consist essentially of $Cu(In,Ga)Se_2$, and the output signal of the spectrophotometer identifies said first deposited surface's reflectance at at least a first and a second discrete preselected wavelength;
   the method further comprising computing a quality function directly related to a ratio of said first deposited thin film's surface's reflectance at the first discrete preselected wavelength and said first deposited thin film's surface's reflectance at the second discrete preselected wavelength and using the quality function to generate the control signal.

7. A method of claim 6 in which the first discrete preselected wavelength is in the red-orange region of the spectrum and the second discrete preselected wavelength is in the green region of the spectrum.

8. A method of claim 7 in which the first discrete preselected wavelength is approximately 640 nm and the second discrete preselected wavelength is approximately 540 nm.

\* \* \* \* \*